(12) United States Patent
Okada et al.

(10) Patent No.: US 8,222,162 B2
(45) Date of Patent: Jul. 17, 2012

(54) BATCH PROCESSING METHOD FOR FORMING STRUCTURE INCLUDING AMORPHOUS CARBON FILM

(75) Inventors: Mitsuhiro Okada, Nirasaki (JP); Yukio Tojo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 50 days.

(21) Appl. No.: 12/792,274

(22) Filed: Jun. 2, 2010

(65) Prior Publication Data

US 2010/0311251 A1 Dec. 9, 2010

(30) Foreign Application Priority Data

Jun. 4, 2009 (JP) ................................. 2009-135483
Apr. 15, 2010 (JP) ................................. 2010-094417

(51) Int. Cl.
*H01L 21/31* (2006.01)
*H01L 21/469* (2006.01)

(52) U.S. Cl. ........ 438/761; 438/680; 438/758; 438/479; 438/482; 438/778

(58) Field of Classification Search .................. 438/761, 438/680, 781, 623, 788, 624, 789, 790, 787, 438/758, 792, 793, 794, 488, 778, 905, 931, 438/478, 479, 482, 935, 902
See application file for complete search history.

(56) References Cited

U.S. PATENT DOCUMENTS

| | | | |
|---|---|---|---|
| 5,981,000 A | 11/1999 | Grill et al. | |
| 2003/0232495 A1* | 12/2003 | Moghadam et al. | 438/623 |
| 2008/0188383 A1* | 8/2008 | Iseki et al. | 508/107 |
| 2010/0189927 A1* | 7/2010 | Sato et al. | 427/579 |

FOREIGN PATENT DOCUMENTS

JP 2006-140222 6/2006

* cited by examiner

*Primary Examiner* — Ha Tran T Nguyen
*Assistant Examiner* — Thanh Y Tran
(74) *Attorney, Agent, or Firm* — Oblon, Spivak, McClelland, Maier & Neustadt, L.L.P.

(57) ABSTRACT

A batch processing method for forming a structure including an amorphous carbon film includes performing a preliminary treatment of removing water from a surface of the underlying layer by heating the inside of the reaction chamber at a preliminary treatment temperature of 800 to 950° C. and supplying a preliminary treatment gas selected from the group consisting of nitrogen gas and ammonia gas into the reaction chamber while exhausting gas from inside the reaction chamber; and, then performing main CVD of forming an amorphous carbon film on the underlying layer by heating the inside of the reaction chamber at a main process temperature and supplying a hydrocarbon gas into the reaction chamber while exhausting gas from inside the reaction chamber.

20 Claims, 11 Drawing Sheets

| Surface roughness | PE1 | CE1 | PE2 | CE2 |
|---|---|---|---|---|
| Si wafer | ○ | ○ | ○ | ○ |
| SiO2 wafer | ○ | × | ○ | △ |
| SiN wafer | ◎ | ○ | ◎ | ○ |
| Coverage | 90% or more | | | |

| Surface roughness | PE3 | CE1 | PE4 | CE2 |
|---|---|---|---|---|
| Si wafer | ◎ | ○ | ◎ | ○ |
| SiO$_2$ wafer | ◎ | × | ◎ | △ |
| SiN wafer | ◎ | ○ | ◎ | ○ |
| Coverage | 90% or more | | | |

BATCH PROCESSING METHOD FOR FORMING STRUCTURE INCLUDING AMORPHOUS CARBON FILM

CROSS-REFERENCE TO RELATED PATENT APPLICATIONS

This application claims the benefit of priority from Japanese Patent Applications No. 2009-135483, filed on Jun. 4, 2009, and No. 2010-094417, filed on Apr. 15, 2010, in the Japan Patent Office, the disclosure of both of which is incorporated herein in the entirety by reference.

BACKGROUND OF THE INVENTION

1. Field of the Invention

The present invention relates to a batch processing method for forming a structure including an amorphous carbon film on target objects, such as semiconductor wafers, in a semiconductor process. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

In relation to the process of manufacturing semiconductor devices, inter-level insulating films with a low dielectric constant have been developed to further decrease the resistance or capacitance of interconnecting structures. An amorphous carbon film can be used as an inter-level insulating film with a low dielectric constant. Further, in the process of manufacturing semiconductor devices, plasma etching is performed to form a circuit pattern by use a photo-resist mask patterned by a photolithography technique. In recent years, owing to the demands of miniaturization of semiconductor devices, the thickness of photo-resist films is becoming increasingly smaller. Accordingly, it has become difficult to ensure a sufficient etching resistance only by a photo-resist film. In light of this problem, a pattern duplication technique has been proposed by utilizing a multi-layered resist structure (for example, see Jpn. Pat. Appln. KOKAI Publication No. 2006-140222). For example, a multi-layered resist structure is formed of a lower layer, an intermediate layer, and an upper layer (photo-resist film). An amorphous carbon film can be used as the lower layer of such a multi-layered resist structure.

Where an amorphous carbon film is applied to this purpose, the film is typically formed by plasma CVD (Chemical Vapor Deposition) of the single-substrate type (for example, see U.S. Pat. No. 5,981,000). The apparatus disclosed in this publication is a plasma CVD apparatus of the parallel-plate type configured to form a film by generating plasma inside a chamber while supplying a cyclic hydrocarbon gas into the chamber.

In general, where plasma CVD apparatuses of the single-substrate type are used to form a thin film, the coverage performance of the film tends to be insufficient. Accordingly, it has been studied to form an amorphous carbon film by use of an apparatus that can provide good coverage performance, such as a vertical CVD apparatus of the batch type. However, as described later, the present inventors have found a problem such that, where vertical CVD apparatuses are used to form an amorphous carbon film, the film tends to be deteriorated in surface flatness.

BRIEF SUMMARY OF THE INVENTION

An object of the present invention is to provide a batch processing method for forming a structure including an amorphous carbon film good in surface flatness.

According to a first aspect of the present invention, there is provided a batch processing method for forming a structure including an amorphous carbon film, the method comprising: placing a plurality of target objects at intervals in a vertical direction on an inside of a reaction chamber, each of the target objects including an underlying layer on which the structure is to be formed; then performing a preliminary treatment of removing water from a surface of the underlying layer by heating the inside of the reaction chamber at a preliminary treatment temperature of 800 to 950° C. and supplying a preliminary treatment gas selected from the group consisting of nitrogen gas and ammonia gas into the reaction chamber while exhausting gas from inside the reaction chamber; and then performing main CVD (chemical vapor deposition) of forming an amorphous carbon film on the underlying layer by heating the inside of the reaction chamber at a main process temperature and supplying a hydrocarbon gas into the reaction chamber while exhausting gas from inside the reaction chamber.

According to a second aspect of the present invention, there is provided a batch processing method for forming a structure including an amorphous carbon film, the method comprising: placing a plurality of target objects at intervals in a vertical direction on an inside of a reaction chamber, each of the target objects including an underlying layer on which the structure is to be formed; then performing a preliminary treatment of forming a hydrophobic layer to cover the underlying layer with the hydrophobic layer by heating the inside of the reaction chamber at a preliminary treatment temperature and supplying a preliminary treatment gas into the reaction chamber while exhausting gas from inside the reaction chamber; and then performing main CVD (chemical vapor deposition) of forming an amorphous carbon film on the hydrophobic layer by heating the inside of the reaction chamber at a main process temperature and supplying a hydrocarbon gas into the reaction chamber while exhausting gas from inside the reaction chamber.

According to a third aspect of the present invention, there is provided a computer readable storage medium containing program instructions for execution on a processor, which, when executed by the processor, control a film formation apparatus to perform a method according to the first or second aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
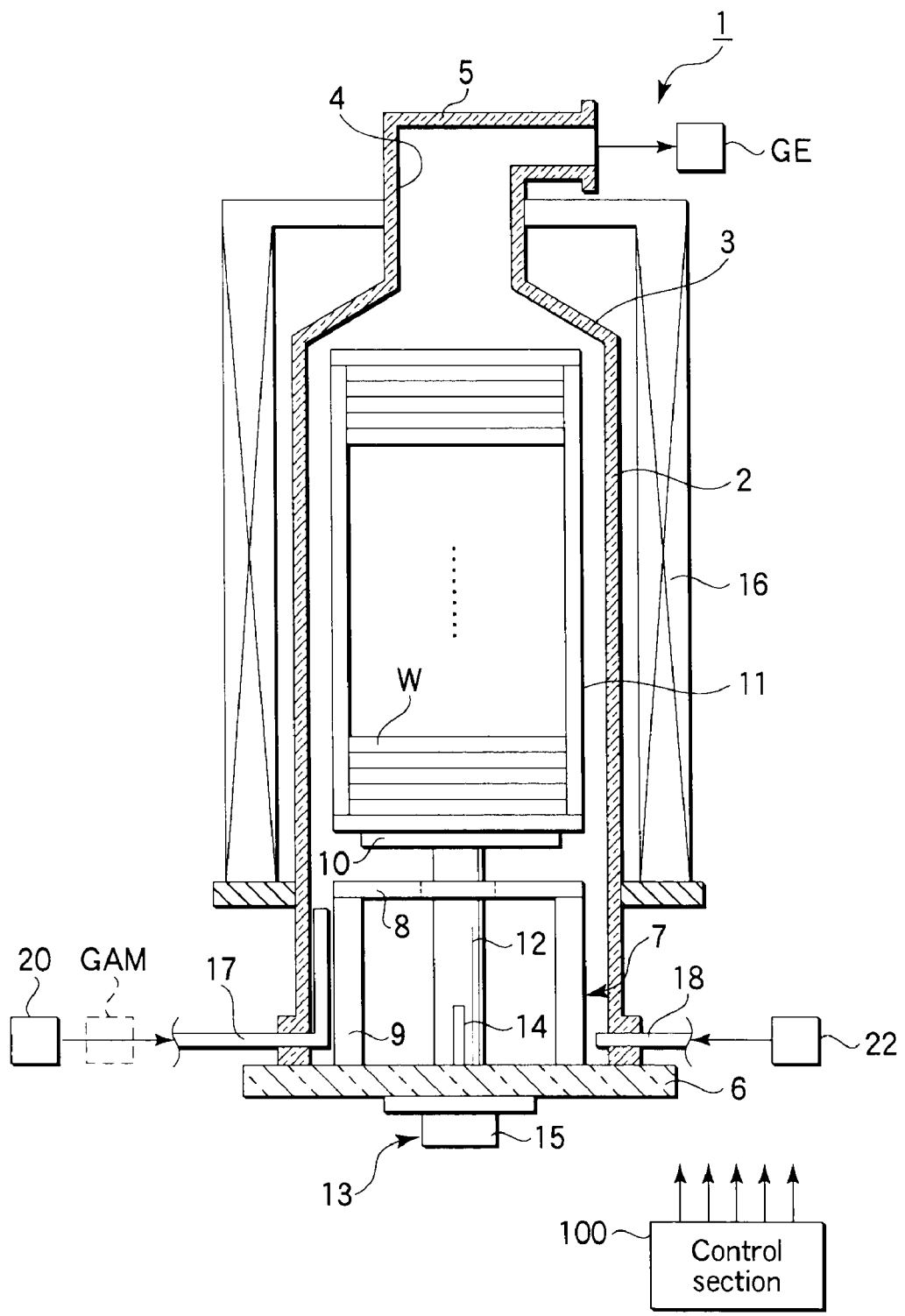
FIG. 1 is a view showing a vertical heat-processing apparatus according to an embodiment of the present invention.

In the process of developing the present invention, the inventors studied problems with regard to methods for forming an amorphous carbon film by vertical CVD apparatuses of the batch type. As a result, the inventors have arrived at the findings given below.

For example, where an amorphous carbon film is used as the lowermost layer of a multi-layered resist structure, an Si-containing inorganic film and a photo-resist film are laminated in this order on the amorphous carbon film. Since an amorphous carbon film formed by the conventional method is poor in surface flatness (i.e., with large surface roughness), this affects the upper layers and deteriorates the pattern duplication accuracy of photolithography.

By studying the mechanism of this deterioration in the surface flatness of the amorphous carbon film, it has been found that moisture present on the underlying layer adversely affects the formation of the amorphous carbon film. In this case, the moisture brings about an abnormal reaction accompanied by etching at the interface between the underlying layer and amorphous carbon film.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a view showing a vertical heat-processing apparatus according to an embodiment of the present invention. As shown in FIG. 1, the heat-processing apparatus 1 includes an essentially cylindrical reaction tube (reaction chamber) 2 whose longitudinal direction is set in the vertical direction. The reaction tube 2 is made of a heat-resistant and corrosion-resistant material, such as quartz.

The top of the reaction tube 2 is formed as an essentially conical ceiling 3 whose diameter decreases toward the top. The ceiling 3 has an exhaust port 4 formed at the center, for exhausting gas from inside the reaction tube 2. The exhaust port 4 is connected to an exhaust section GE through an airtight exhaust line 5. The exhaust section GE has a pressure adjusting mechanism including, e.g., a valve and a vacuum exhaust pump (not shown in FIG. 1, but shown in FIG. 2 with a reference symbol 127). The exhaust section GE is used to exhaust the atmosphere inside the reaction tube 2, and set it at a predetermined pressure (vacuum level).

A lid 6 is disposed below the reaction tube 2. The lid 6 is made of a heat-resistant and corrosion-resistant material, such as quartz. The lid 6 is moved up and down by a boat elevator described later (not shown in FIG. 1, but shown in FIG. 2 with a reference symbol 128). When the lid 6 is moved up by the boat elevator, the bottom of the reaction tube 2 (load port) is closed. When the lid 6 is moved down by the boat elevator, the bottom of the reaction tube 2 (load port) is opened.

A thermally insulating cylinder 7 is disposed on the lid 6. The thermally insulating cylinder 7 is equipped with a planar heater 8 made of a resistive heating body to prevent the temperature inside the reaction tube from decreasing due to heat radiation from the load port of the reaction tube 2. The heater 8 is supported at a predetermined height level relative to the top face of the lid 6 by a cylindrical support 9.

A rotary table 10 is disposed above the thermally insulating cylinder 7. The rotary table 10 is used as a table for rotatably mounting thereon a wafer boat 11 that holds target objects, such as semiconductor wafers W. Specifically, the rotary table 10 is connected to a rotary shaft 12 disposed therebelow. The rotary shaft 12 passes through the center of the heater 8 and is connected to a rotation mechanism 13 for rotating the rotary table 10.

The rotation mechanism 13 is mainly formed of a motor (not shown), and a rotation feeder 15 with an axle 14 that airtightly penetrates the lid 6 from below. The axle 14 is coupled to the rotary shaft 12 of the rotary table 10, to transmit the rotational force of the motor to the rotary table 10 through the rotary shaft 12. When the axle 14 is rotated by the motor of the rotation mechanism 13, the rotational force of the axle 14 is transmitted to the rotary shaft 12, and the rotary table 10 is rotated.

The wafer boat 11 is configured to hold a plurality of, such as 100, semiconductor wafers W at predetermined intervals in the vertical direction. The wafer boat 11 is made of a heat-resistant and corrosion-resistant material, such as quartz. Since the wafer boat 11 is mounted on the rotary table 10, the wafer boat 11 is rotated along with the rotary table 10, and thus the semiconductor wafers W held in the wafer boat 11 are rotated.

A heater 16 made of, e.g., a resistive heating body is disposed near the reaction tube 2 to surround the tube 2. The inside of the reaction tube 2 is heated by the heater 16, so that the semiconductor wafers W are heated up (increase in temperature) to a predetermined temperature.

Process gas feed lines 17 penetrate the sidewall of the reaction tube 2 near the bottom, and are used for supplying process gases into the reaction tube 2. Each of the process gas feed lines 17 is connected to a process gas supply section 20 through a mass-flow controller (MFC) (not shown). Although FIG. 1 shows only one process gas feed line 17, a plurality of process gas feed lines 17 are disposed in accordance with the type of gases in this embodiment. A purge gas supply line 18 also penetrates the sidewall of the reaction tube 2 near the bottom. The purge gas supply line 18 is connected to a supply section 22 of a purge gas (such as nitrogen ($N_2$) gas) through a mass-flow controller (MFC) (not shown).

The process gas supply section 20 includes a supply source of a hydrocarbon gas, a supply source of a silicon source gas, a supply source of a moisture removing gas, a supply source of a reactive gas (oxidizing gas/nitriding gas).

The hydrocarbon gas is used for forming an amorphous carbon film by CVD. The hydrocarbon gas is exemplified by ethylene ($C_2H_4$), methane ($CH_4$), ethane ($C_2H_6$), acetylene ($C_2H_2$), and butyne ($C_4H_6$). In the disclosed embodiments, as described later, ethylene gas is used as the hydrocarbon gas.

The silicon source gas is used for forming a hydrophobic layer of silicon by CVD between the underlying layer and amorphous carbon film. The silicon source gas are also used for forming an Si-containing inorganic film by CVD on top of the amorphous carbon film. The silicon source gas is exemplified by DCS (dichlorosilane), HCD (hexachlorodisilane), TDMAS (tridimethylaminosilane), BTBAS (bistertialbutylaminosilane), BDMAS (bisdimethylaminosilane), BDEAS (bisdiethylaminosilane), DMAS (dimethylaminosilane), DEAS (diethylaminosilane), DPAS (dipropylaminosilane), and BAS (butylaminosilane). Of them, the silicon source gas is preferably an aminosilane gas containing no chlorine (Cl). Where the gas does not contain any chlorine, the incubation time is shortened. In some of the disclosed embodiments, as described later, BTBAS or DCS gas is used as the silicon source gas.

The moisture removing gas is used for removing moisture from the surface of the underlying layer before the amorphous carbon film is formed. The moisture removing gas is exemplified by nitrogen ($N_2$) gas or ammonia ($NH_3$) gas. Where nitrogen gas is used as the moisture removing gas, the nitrogen gas may be gas supplied from the supply section 22 through the purge gas supply line 18. In this case, the process gas supply section 20 may include no supply source of the moisture removing gas.

The reactive gas is used for forming an Si-containing inorganic film by CVD on the amorphous carbon film. Where the Si-containing inorganic film is an oxide film, an oxidizing gas (oxygen-containing gas) is used as the reactive gas. The oxidizing gas is exemplified by $O_2$, NO, $N_2O$, $H_2O$, and $O_3$. Where the Si-containing inorganic film is a nitride film, a nitriding gas (nitrogen-containing gas) is used as the reactive gas. The nitriding gas is exemplified by $NH_3$, $N_2$, NO, $N_2O$, and $N_2H_4$. Where ammonia gas is used as the moisture removing gas, the same supply source of ammonia gas may be used for the reactive gas (nitriding gas) and for the moisture removing gas.

Figure 2:
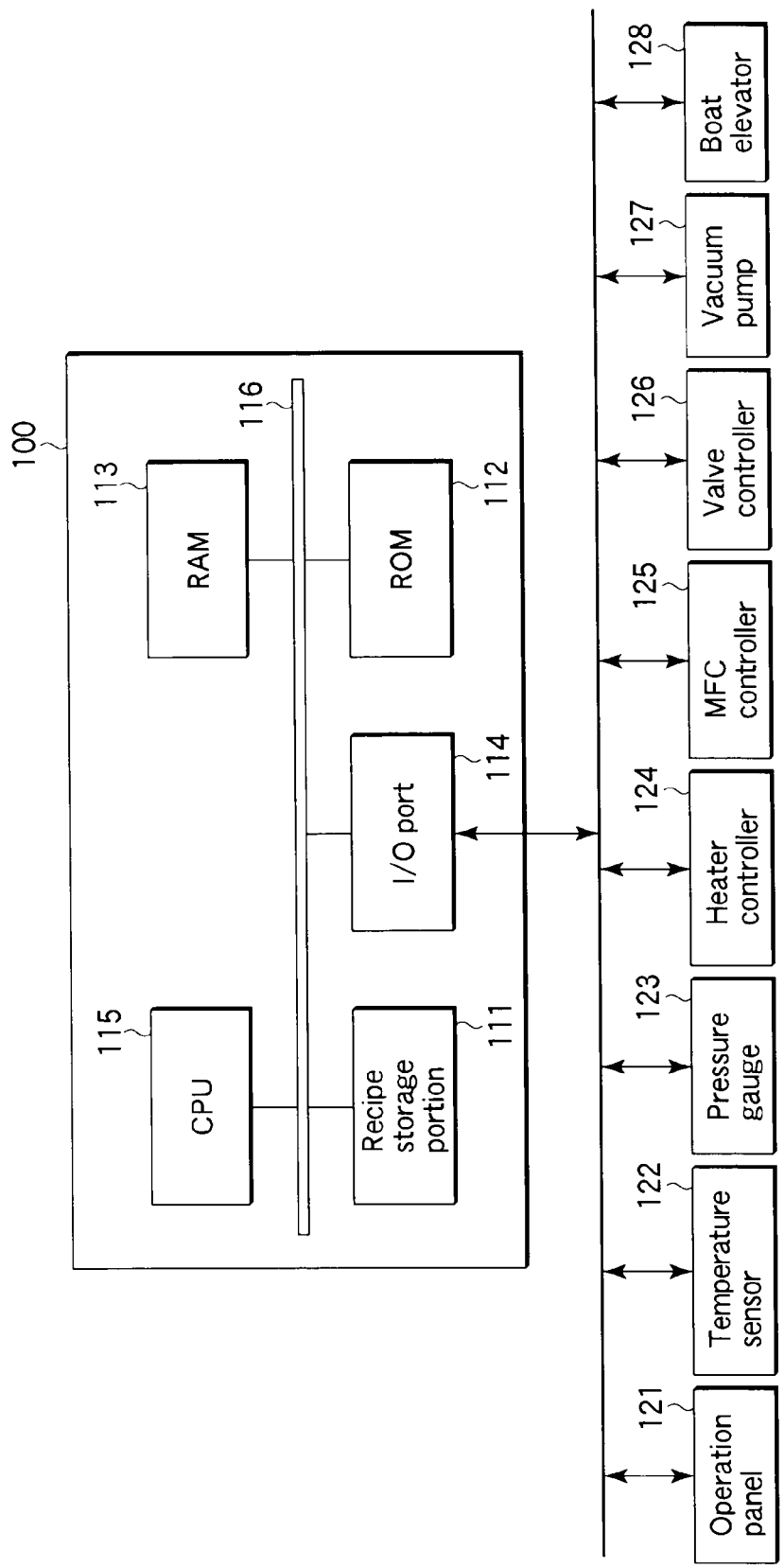
FIG. 2 is a view showing the structure of the control section of the apparatus shown in FIG. 1.

The heat-processing apparatus 1 further includes a control section 100 for controlling respective portions of the apparatus. FIG. 2 is a view showing the structure of the control section 100. As shown in FIG. 2, the control section 100 is connected to an operation panel 121, (a group of) temperature sensors 122, (a group of) pressure gages 123, heater controllers 124, MFC controllers 125, valve controllers 126, a vacuum pump 127, a boat elevator 128, and so forth.

The operation panel 121 includes a display screen and operation buttons, and is configured to transmit operator's instructions to the control section 100, and show various data transmitted from the control section 100 on the display screen. The (group of) temperature sensors 122 are configured to measure the temperature at respective portions inside the reaction tube 2, exhaust line 5, and process gas feed lines 17, and to transmit measurement values to the control section 100. The (group of) pressure gages 123 are configured to measure the pressure at respective portions inside the reaction tube 2, exhaust line 5, and process gas feed lines 17, and to transmit measurement values to the control section 100.

The heater controllers 124 are configured to respectively control the heater 8 and heater 16. The heater controllers 124 turn on these heaters to generate heat in accordance with instructions from the control section 100. Further, the heater controllers 124 measure the power consumption of these heaters, and transmit it to the control section 100.

The MFC controllers 125 are configured to respectively control the MFCs (not shown) disposed on the process gas feed lines 17 and the purge gas supply line 18. The MFC controllers 125 control the flow rates of gases flowing through the MFCs in accordance with instructions from the control section 100. Further, the MFC controllers 125 measure the flow rates of gases flowing through the MFCs, and transmit them to the control section 100.

The valve controllers 126 are respectively disposed on piping lines and configured to control the opening rate of valves disposed on piping lines in accordance with instructed values received from the control section 100. The vacuum pump 127 is connected to the exhaust line 5 and configured to exhaust gas from inside the reaction tube 2.

The boat elevator 128 is configured to move up the lid 6, so as to load the wafer boat 11 (semiconductor wafers W) placed on the rotary table 10 into the reaction tube 2. The boat elevator 128 is also configured to move the lid 6 down, so as to unload the wafer boat 11 (semiconductor wafers W) placed on the rotary table 10 from the reaction tube 2.

The control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the heat-processing apparatus 1 is manufactured, only the setup recipe is initially stored. The setup recipe is executed when a thermal model or the like for a specific heat-processing apparatus is formed. The process recipes are prepared respectively for heat processes to be actually performed by a user. Each process recipe prescribes temperature changes at respective portions, pressure changes inside the reaction tube 2, start/stop timing for supply of process gases, and supply rates of process gases, from the time semiconductor wafers W are loaded into the reaction tube 2 to the time processed wafers W are unloaded.

The ROM 112 is a storage medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controllers 124, MFC controllers 125, valve controllers 126, vacuum pump 127, and boat elevator 128, and is configured to control output/input of data or signals.

The CPU (Central Processing Unit) 115 is the hub of the control section 100. The CPU 115 is configured to run control programs stored in the ROM 112, and control an operation of the heat-processing apparatus 1, in accordance with a recipe (process recipe) stored in the recipe storage portion 111, following instructions from the operation panel 121. Specifically, the CPU 115 causes the (group of) temperature sensors 122, (group of) pressure gages 123, and MFC controllers 125 to measure temperatures, pressures, and flow rates at respective portions inside the reaction tube 2, exhaust line 5, process gas feed lines 17, and so forth. Further, the CPU 115 outputs control signals, based on measurement data, to the heater controllers 124, MFC controllers 125, valve controllers 126, and vacuum pump 127, to control the respective portions mentioned above in accordance with a process recipe.

Next, an explanation will be given of a batch processing method for forming a structure including an amorphous carbon film according to embodiments of the present invention performed in the heat-processing apparatus 1 shown in FIGS. 1 and 2. In the following explanation, the respective components of the heat-processing apparatus 1 are operated under the control of the control section 100 (CPU 115). The temperature and pressure inside the reaction tube 2 and the gas flow rates during the processes are set in accordance with a recipe, as explained below, while the control section 100 (CPU 115) controls the heater controller 124 (for the heaters 8 and 16), MFC controllers 125 (for the process gas feed lines 17 and purge gas feed line 18), valve controllers 126, and vacuum pump 127.

<First Embodiment>

Figure 3:
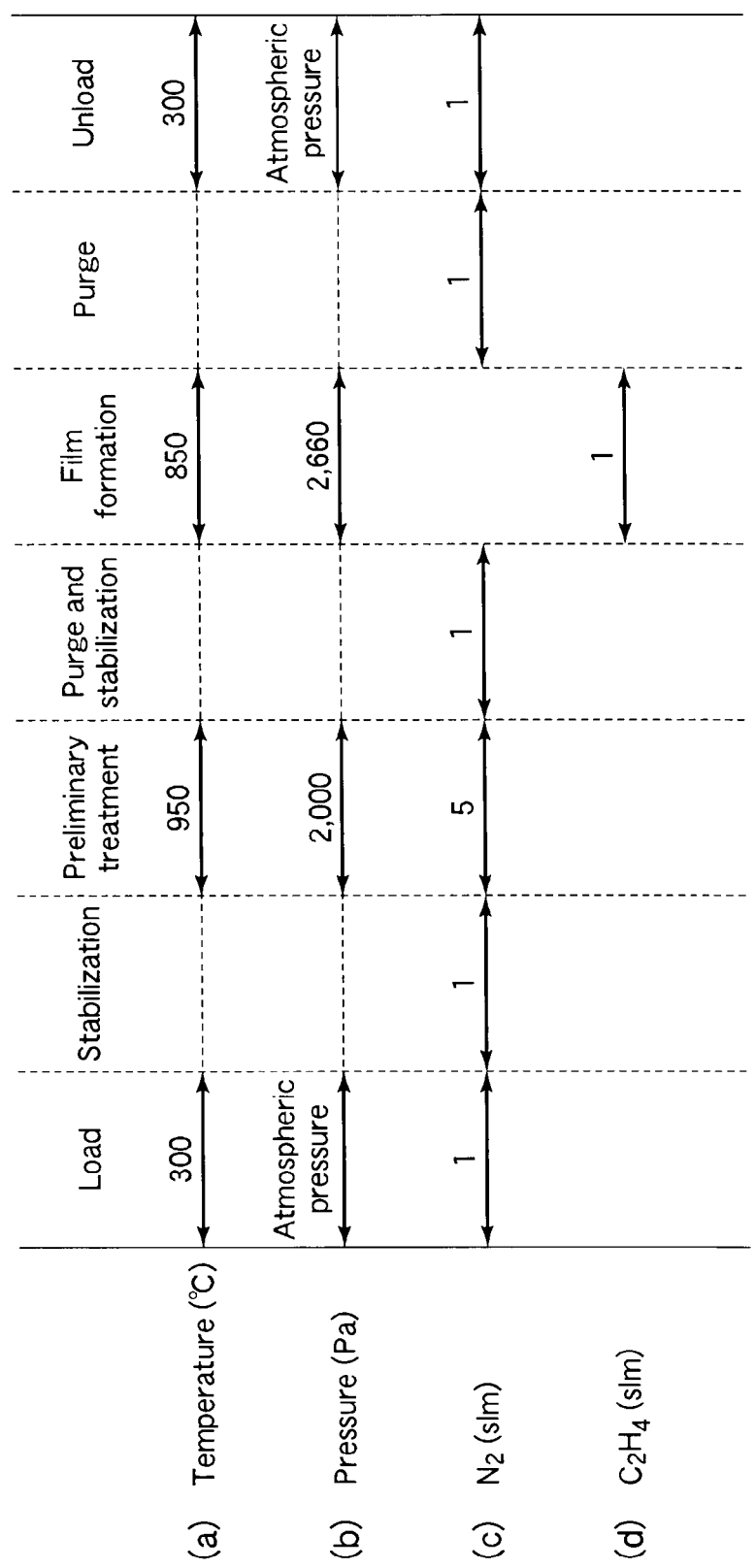
FIG. 3 is a view showing the recipe of a batch processing method for forming a structure including an amorphous carbon film according to a first embodiment of the present invention.

FIG. 3 is a view showing the recipe of a batch processing method for forming a structure including an amorphous carbon film according to a first embodiment of the present invention. In this method, an $N_2$ preliminary treatment (high-temperature $N_2$ purge) is first performed to remove water (moisture) from the surface of the underlying layer on each of the semiconductor wafers W. Then, an amorphous carbon film is formed on the underlying layer.

Specifically, at first, the inside of the reaction tube 2 is heated by the heater 16 at a predetermined load temperature, such as 300° C., as shown in FIG. 3, (a). Further, nitrogen ($N_2$) gas is supplied through the purge gas feed line 18 into the reaction tube 2 at a predetermined flow rate, such as 1 slm (1 liter/min), as shown in FIG. 3, (c). Then, a wafer boat 11 that holds semiconductor wafers W is placed on the lid 6, and the lid 6 is moved up by the boat elevator 128. Consequently, the wafer boat 11 with the semiconductor wafers W supported thereon is loaded into the reaction tube 2 and the reaction tube 2 is airtightly closed (load step).

Then, nitrogen gas is supplied through the purge gas feed line 18 into the reaction tube 2 at a predetermined flow rate, such as 1 slm, as shown in FIG. 3, (c). Further, the inside of the reaction tube 2 is heated by the heater 16 to a predetermined temperature, such as 950° C., as shown in FIG. 3, (a). Furthermore, gas is exhausted from inside the reaction tube 2 to set the inside of the reaction tube 2 at a predetermined pressure, such as 2,000 Pa (15 Torr), as shown in FIG. 3, (b). By doing so, the inside of the reaction tube 2 is stabilized at the temperature and pressure described above (stabilization step).

At this time, the temperature inside the reaction tube 2 is preferably set to be 800 to 950° C., and more preferably to be 850 to 900° C. If this temperature is lower than 800° C., it may become difficult to sufficiently remove water (moisture) from the surface of the semiconductor wafers W. If this temperature is higher than 950° C., the semiconductor wafers W may cause roughening of the surface. The pressure inside the reaction tube 2 is preferably set to be 13.3 Pa (0.1 Torr) to 6,650 Pa (50 Torr), and more preferably to be 13.3 Pa (0.1 Torr) to 2,660 Pa (20 Torr).

When the inside of the reaction tube 2 is stabilized at the predetermined pressure and temperature, nitrogen gas is supplied through the purge gas feed line 18 into the reaction tube 2 at a predetermined flow rate, such as 5 slm, as shown in FIG. 3, (c), wherein the nitrogen gas serves as a moisture removing gas to perform nitrogen purge (preliminary treatment step). Since water on the surface of the semiconductor wafers W is removed by this $N_2$ preliminary treatment, the underlying layer for the amorphous carbon film is free from water present (adsorbed) thereon. Accordingly, when the amorphous carbon film is formed, an abnormal reaction accompanied by etching at the interface between the underlying layer and amorphous carbon film can be hardly caused, and so the surface roughness is suppressed.

Then, while gas is exhausted from inside the reaction tube 2, nitrogen gas is supplied through the purge gas feed line 18 into the reaction tube 2 at a predetermined flow rate, such as 1 slm, as shown in FIG. 3, (c). Then, gas is exhausted from inside the reaction tube 2 to set the inside of the reaction tube 2 at a predetermined pressure, such as 2,660 Pa (20 Torr), as shown in FIG. 3, (b). Further, the inside of the reaction tube 2 is heated by the heater 16 to a predetermined temperature, such as 850° C., as shown in FIG. 3, (a). By doing so, the inside of the reaction tube 2 is stabilized at the temperature and pressure described above (purge and stabilization step).

At this time, the temperature inside the reaction tube 2 is preferably set to be 800 to 900° C., and more preferably to be 800 to 850° C. If this temperature is higher than 900° C., the surface roughness of the amorphous carbon film may become larger. If this temperature is lower than 800° C., it may become difficult to lower the pressure inside the reaction tube 2, thereby deteriorate the surface flatness of the amorphous carbon film. The pressure inside the reaction tube 2 is preferably set to be 13.3 Pa (0.1 Torr) to 6,650 Pa (50 Torr), and more preferably to be 13.3 Pa (0.1 Torr) to 2,660 Pa (20 Torr).

When the inside of the reaction tube 2 is stabilized at the predetermined pressure and temperature, the supply of nitrogen gas through the purge gas feed line 18 is stopped. Then, a film formation gas (hydrocarbon gas) is supplied through a process gas feed line 17 into the reaction tube 2 at a predetermined flow rate. In this embodiment, for example, ethylene ($C_2H_4$) gas is supplied at 1 slm (1 liter/min), as shown in FIG. 3, (d). The film formation gas supplied into the reaction tube 2 causes a thermal decomposition reaction, using heat inside the reaction tube 2. Consequently, an amorphous carbon film is formed on the underlying layer (the substrate of the wafers W or a layer of, e.g., metal, semiconductor, or insulator formed on the wafers W) on the surface of the semiconductor wafers W (film formation step).

As described above, since the $N_2$ preliminary treatment is performed to remove water (moisture) from the surface of the semiconductor wafers W before the amorphous carbon film is formed, an abnormal reaction accompanied by etching at the interface between the underlying layer and amorphous carbon film can be hardly caused during the film formation, and so the surface roughness becomes smaller. Further, since the amorphous carbon film is formed by a vertical CVD apparatus of the batch type, the amorphous carbon film is formed with better coverage performance. Accordingly, this method makes it possible to form an amorphous carbon film with better coverage performance and smaller surface roughness.

When the amorphous carbon film formed on the surface of the semiconductor wafers W reaches a predetermined thickness, such as 30 nm, the supply of film formation gas through the process gas feed line 17 is stopped. Then, while gas is exhausted from inside reaction tube 2, nitrogen gas is supplied through the purge gas feed line 18 into reaction tube 2 at a predetermined flow rate, such as 1 slm, as shown in FIG. 3, (c). By doing so, the gas is exhausted from inside the reaction tube 2 to the exhaust line 5 (purge step). It is preferable to perform cyclic purge of repeating the gas exhaust and nitrogen gas supply for the inside of the reaction tube 2 a plurality of times, in order to reliably exhaust gas from inside the reaction tube 2.

Then, nitrogen gas is supplied through the purge gas feed line 18 into the reaction tube 2 at a predetermined flow rate, such as 1 slm, as shown in FIG. 3, (c), so that the pressure inside the reaction tube 2 is returned to atmospheric pressure, as shown in FIG. 3, (b). Further, the inside of the reaction tube 2 is set by the heater 16 at a predetermined temperature, such as 300° C., as shown in FIG. 3, (a). Then, the lid 6 is moved down by the boat elevator 128, and the semiconductor wafers W are thereby unloaded along with wafer boat 11 from the reaction tube 2 (unload step). The formation of the amorphous carbon film is thus completed.

<Experiment 1>

In order to confirm some effects of the $N_2$ preliminary treatment (high-temperature $N_2$ purge) according to the first embodiment, an experiment was performed, as follows. In this experiment, an Si wafer, an $SiO_2$ wafer, and an SiN wafer (which mean that their wafer surfaces consist of Si, $SiO_2$, and SiN, respectively) were used as target objects. As a present example PE1, the $N_2$ preliminary treatment and amorphous carbon film formation were performed under the conditions described in the first embodiment. As a present example PE2, the $N_2$ preliminary treatment was performed under the conditions described in the first embodiment, and then the amorphous carbon film formation was performed while setting the temperature and pressure inside the reaction tube 2 at 800° C. and 6,650 Pa (50 Torr), respectively. As comparative examples CE1 and CE2, the amorphous carbon film formation was performed under the same conditions as those of the present examples PE1 and PE2, without performing the preliminary treatment.

Then, the deposition rate and film formation state of the amorphous carbon films formed in these present examples and comparative examples were examined. For the examination, the surface and cross section of the amorphous carbon films were observed by a scanning electron microscope (SEM). The surface roughness was assessed by use of four grades, "very good (⊚)", "good (○)", "not good (Δ)", and "bad (X)". Further, the coverage performance of the films was examined.

Figures 4, 5:
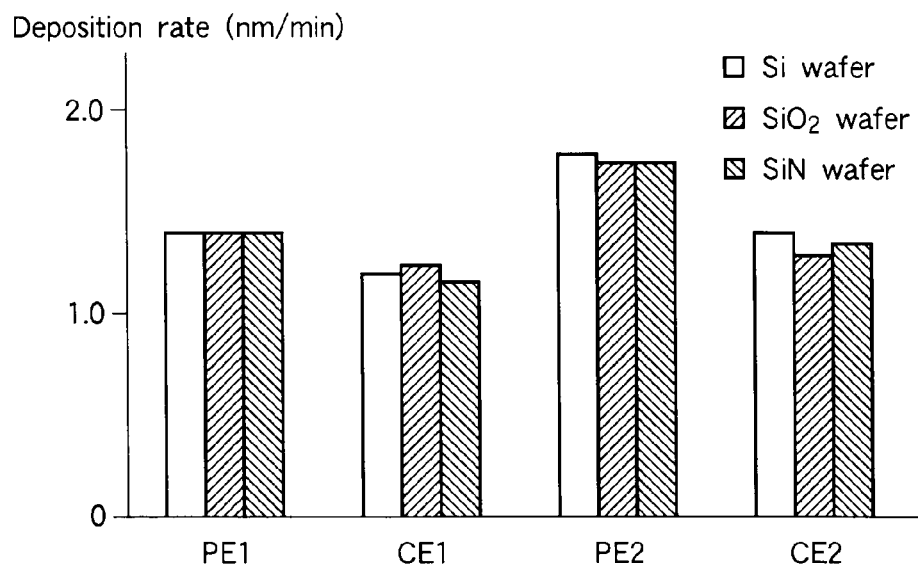
FIG. 4 is a view showing the deposition rate of amorphous carbon films obtained by an experiment 1.
FIG. 5 is a diagram showing the film formation state of amorphous carbon films obtained by the experiment 1.

FIG. 4 is a view showing the deposition rate of the amorphous carbon films obtained by the experiment 1. FIG. 5 is a diagram showing the film formation state of the amorphous carbon films obtained by the experiment 1. As evidenced by comparison of the present examples PE1 and PE2 with the comparative examples CE1 and CE2, the deposition rate (nm/min) was improved by performing the $N_2$ preliminary treatment for all the types of target object. Further, the surface roughness became smaller by performing the $N_2$ preliminary treatment for all the types of target object. On the other hand, the coverage performance was as good as 90% or more for all the types of target object, regardless of whether or not the $N_2$ preliminary treatment was performed. As described above, it has been confirmed that the batch processing method including the $N_2$ preliminary treatment thus performed makes it possible to form an amorphous carbon film with an increased deposition rate, better coverage performance, and smaller surface roughness.

<Second Embodiment>

Figure 6:
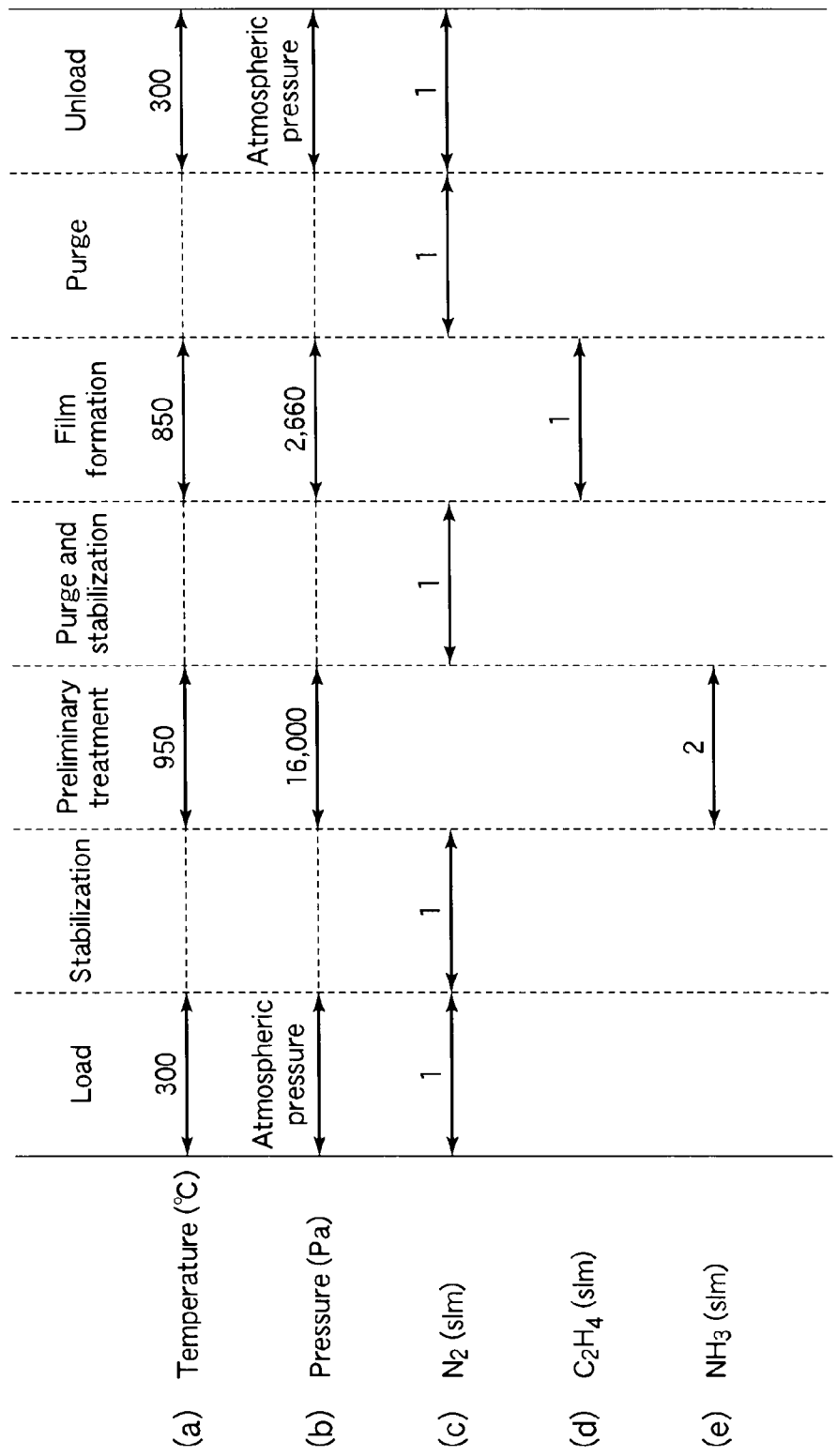
FIG. 6 is a view showing the recipe of a batch processing method for forming a structure including an amorphous carbon film according to a second embodiment of the present invention.

FIG. 6 is a view showing the recipe of a batch processing method for forming a structure including an amorphous carbon film according to a second embodiment of the present invention. In this method, an ammonia preliminary treatment (high-temperature ammonia purge) is first performed to remove water (moisture) from the surface of the underlying layer on each of the semiconductor wafers W. Then, an amorphous carbon film is formed on the underlying layer.

Specifically, at first, the inside of the reaction tube 2 is heated by the heater 16 at a predetermined load temperature, such as 300° C., as shown in FIG. 6, (a). Further, nitrogen ($N_2$) gas is supplied through the purge gas feed line 18 into the reaction tube 2 at a predetermined flow rate, such as 1 slm (1 liter/min), as shown in FIG. 6, (c). Then, a wafer boat 11 that holds semiconductor wafers W is placed on the lid 6, and the lid 6 is moved up by the boat elevator 128. Consequently, the wafer boat 11 with the semiconductor wafers W supported thereon is loaded into the reaction tube 2 and the reaction tube 2 is airtightly closed (load step).

Then, nitrogen gas is supplied through the purge gas feed line 18 into the reaction tube 2 at a predetermined flow rate, such as 1 slm, as shown in FIG. 6, (c). Further, the inside of the reaction tube 2 is heated by the heater 16 to a predetermined temperature, such as 950° C., as shown in FIG. 6, (a). Furthermore, gas is exhausted from inside the reaction tube 2 to set the inside of the reaction tube 2 at a predetermined pressure, such as 16,000 Pa (120 Torr), as shown in FIG. 6, (b). By doing so, the inside of the reaction tube 2 is stabilized at the temperature and pressure described above (stabilization step).

At this time, the temperature inside the reaction tube 2 is preferably set to be 800 to 950° C. If this temperature is lower than 800° C., it may become difficult to sufficiently remove water (moisture) from the surface of the semiconductor wafers W. If this temperature is higher than 950° C., the semiconductor wafers W may cause roughening of the surface. This temperature is more preferably set to be 850 to 900° C., because the surface roughness is more improved within this range. The pressure inside the reaction tube 2 is preferably set to be 133 Pa (1 Torr) to 53,200 Pa (400 Torr), and more preferably to be 133 Pa (1 Torr) to 26,600 Pa (200 Torr).

When the inside of the reaction tube 2 is stabilized at the predetermined pressure and temperature, the supply of nitrogen gas through the purge gas feed line 18 is stopped. Then, ammonia gas ($NH_3$) is supplied through a process gas feed line 17 into the reaction tube 2 at a predetermined flow rate, such as 2 slm, as shown in FIG. 6, (e), wherein the ammonia gas serves as a moisture removing gas to perform ammonia purge (preliminary treatment step). Since water on the surface of the semiconductor wafers W is removed by this ammonia preliminary treatment, the underlying layer for the amorphous carbon film is free from water present (adsorbed) thereon. Accordingly, when the amorphous carbon film is formed, an abnormal reaction accompanied by etching at the interface between the underlying layer and amorphous carbon film can be hardly caused. Further, since the ammonia preliminary treatment serves to nitride the surface of the semiconductor wafers W, the semiconductor wafers W are prevented from roughening the surface.

When the ammonia preliminary treatment is finished, the supply of ammonia gas through the process gas feed line 17 is stopped. Then, while gas is exhausted from inside the reaction tube 2, nitrogen gas is supplied through the purge gas feed line 18 into the reaction tube 2 at a predetermined flow rate, such as 1 slm, as shown in FIG. 6, (c). Then, gas is exhausted from inside the reaction tube 2 to set the inside of the reaction tube 2 at a predetermined pressure, such as 2,660 Pa (20 Torr), as shown in FIG. 6, (b). Further, the inside of the reaction tube 2 is heated by the heater 16 to a predetermined temperature, such as 850° C., as shown in FIG. 6, (a). By doing so, the inside of the reaction tube 2 is stabilized at the temperature and pressure described above (purge and stabilization step). At this time, the preferable ranges of the temperature and pressure inside the reaction tube 2 are the same as those of the first embodiment.

When the inside of the reaction tube 2 is stabilized at the predetermined pressure and temperature, the supply of nitrogen gas through the purge gas feed line 18 is stopped. Then, a film formation gas (hydrocarbon gas) is supplied through a process gas feed line 17 into the reaction tube 2 at a predetermined flow rate. In this embodiment, for example, ethylene ($C_2H_4$) gas is supplied at 1 slm (1 liter/min), as shown in FIG. 6, (d). The film formation gas supplied into the reaction tube 2 causes a thermal decomposition reaction, using heat inside the reaction tube 2. Consequently, an amorphous carbon film is formed on the underlying layer (the substrate of the wafers W or a layer of, e.g., metal, semiconductor, or insulator formed on the wafers W) on the surface of the semiconductor wafers W (film formation step).

As described above, since the ammonia preliminary treatment is performed to remove water (moisture) from the surface of the semiconductor wafers W before the amorphous carbon film is formed, an abnormal reaction accompanied by etching at the interface between the underlying layer and amorphous carbon film can be hardly caused during the film formation, and so the surface roughness becomes smaller. Particularly, the ammonia preliminary treatment serves to nitride the underlying layer on the surface of the semiconductor wafers W, and so the surface roughness of the amorphous carbon film is suppressed even where the thickness of the film is small. Further, since the amorphous carbon film is formed by a vertical CVD apparatus of the batch type, the amorphous carbon film is formed with better coverage performance. Accordingly, this method makes it possible to form an amorphous carbon film with better coverage performance and smaller surface roughness.

When the amorphous carbon film formed on the surface of the semiconductor wafers W reaches a predetermined thickness, such as 30 nm, the supply of film formation gas through the process gas feed line 17 is stopped. Then, while gas is exhausted from inside reaction tube 2, nitrogen gas is supplied through the purge gas feed line 18 into reaction tube 2 at a predetermined flow rate, such as 1 slm, as shown in FIG. 6, (c). By doing so, the gas is exhausted from inside the reaction tube 2 to the exhaust line 5 (purge step). It is preferable to perform cyclic purge of repeating the gas exhaust and nitrogen gas supply for the inside of the reaction tube 2 a plurality of times, in order to reliably exhaust gas from inside the reaction tube 2.

Then, nitrogen gas is supplied through the purge gas feed line 18 into the reaction tube 2 at a predetermined flow rate, such as 1 slm, as shown in FIG. 6, (c), so that the pressure inside the reaction tube 2 is returned to atmospheric pressure, as shown in FIG. 6, (b). Further, the inside of the reaction tube 2 is set by the heater 16 at a predetermined temperature, such as 300° C., as shown in FIG. 6, (a). Then, the lid 6 is moved down by the boat elevator 128, and the semiconductor wafers W are thereby unloaded along with wafer boat 11 from the reaction tube 2 (unload step). The formation of the amorphous carbon film is thus completed.

<Experiment 2>

In order to confirm some effects of the ammonia preliminary treatment (high-temperature ammonia purge) according to the second embodiment, an experiment was performed, as follows. In this experiment, an Si wafer, an $SiO_2$ wafer, and an SiN wafer were used as target objects. As a present example PE3, the ammonia preliminary treatment and amorphous carbon film formation were performed under the conditions described in the second embodiment. As a present example PE4, the ammonia preliminary treatment was performed under the conditions described in the second embodiment, and then the amorphous carbon film formation was performed while setting the temperature and pressure inside the reaction tube 2 at 800° C. and 6,650 Pa (50 Torr), respectively.

Then, the deposition rate and film formation state of the amorphous carbon films formed in these present examples were examined. For the examination, the surface and cross section of the amorphous carbon films were observed by a scanning electron microscope (SEM). The surface roughness was assessed by use of four grades, "very good (⊚)", "good (○)", "not good (Δ)", and "bad (X)". Further, the coverage performance of the films was examined.

Figures 7, 8:
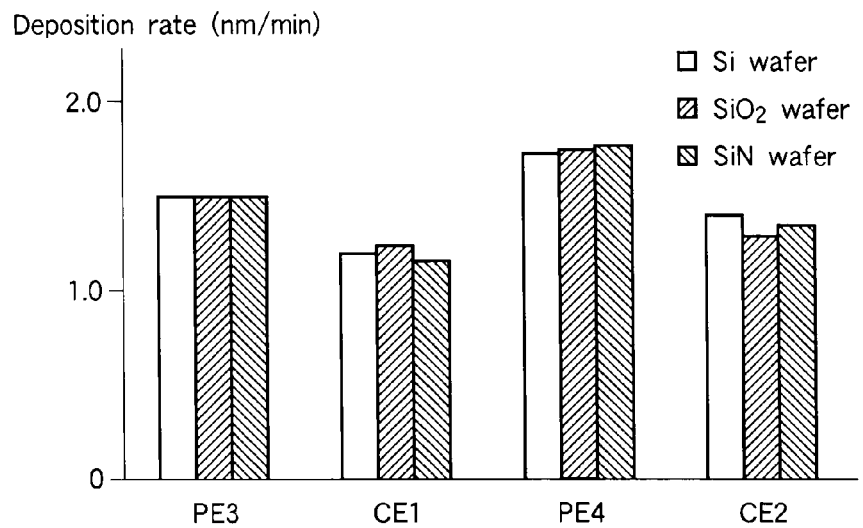
FIG. 7 is a view showing the deposition rate of amorphous carbon films obtained by an experiment 2.
FIG. 8 is a diagram showing the film formation state of amorphous carbon films obtained by the experiment 2.

FIG. 7 is a view showing the deposition rate of the amorphous carbon films obtained by an experiment 2. FIG. 8 is a diagram showing the film formation state of the amorphous carbon films obtained by the experiment 2. FIGS. 7 and 8 also show the data of the comparative examples CE1 and CE2 described above, for comparison. As evidenced by comparison of the present examples PE3 and PE4 with the comparative examples CE1 and CE2, the deposition rate (nm/min) was improved by performing the ammonia preliminary treatment for all the types of target object. Further, the surface roughness became smaller by performing the ammonia preliminary treatment for all the types of target object. On the other hand, the coverage performance was as good as 90% or more for all the types of target object, regardless of whether or not the ammonia preliminary treatment was performed. As described above, it has been confirmed that the batch processing method including the ammonia preliminary treatment thus performed makes it possible to form an amorphous carbon film with an increased deposition rate, better coverage performance, and smaller surface roughness.

<Experiment 3>

In order to confirm some effects of the $N_2$ preliminary treatment (high-temperature $N_2$ purge) according to the first embodiment and some effects of the ammonia preliminary treatment (high-temperature ammonia purge) according to the second embodiment, an experiment was performed, as follows. In this experiment, an Si wafer, an $SiO_2$ wafer, and an SiN wafer were used as target objects. As present examples PE5 to PE11, the preliminary treatment (high-temperature $N_2$ purge or high-temperature ammonia purge) was performed under the conditions shown in FIG. 9A, and then the amorphous carbon film formation was performed under the conditions shown in FIG. 9A to provide a film thickness of 15 nm.

Then, the surface roughness of the amorphous carbon films formed in these present examples was examined by a method different from the scanning electron microscope (SEM) observation used in the experiments 1 and 2. Specifically, an atomic force microscope compliant with JIS B0601 was used to measure the surface roughness (Ra).

Figures 9A, 9B:
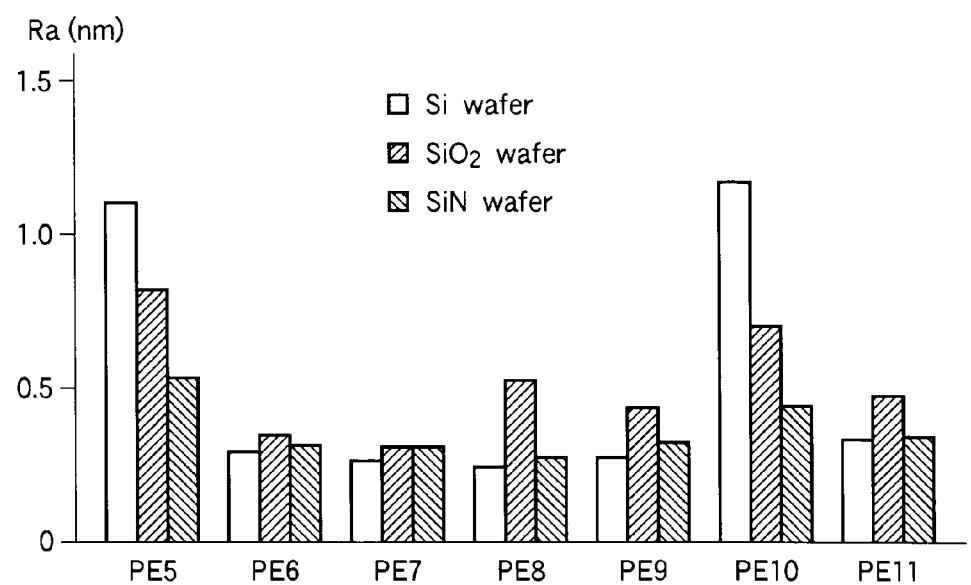
FIG. 9A is a diagram showing the conditions of the preliminary treatment and amorphous carbon film formation used in an experiment 3.
FIG. 9B is a view showing the surface roughness (Ra) of amorphous carbon films obtained by the experiment 3.

FIG. 9B is a view showing the surface roughness (Ra) of the amorphous carbon films obtained by the experiment 3. As shown in FIG. 9B, the present examples using the ammonia preliminary treatment rendered smaller values of the surface roughness (Ra) than those of the present examples using the $N_2$ preliminary treatment. Accordingly, it has been confirmed that, where the amorphous carbon film has a smaller thickness and thus tends to increase the surface roughness, the ammonia preliminary treatment is more preferably employed than the $N_2$ preliminary treatment. However, this is just a comparison between the $N_2$ preliminary treatment and ammonia preliminary treatment, and the results of the surface roughness obtained by the $N_2$ preliminary treatment do not have any problem. Further, where the temperature inside the reaction tube 2 during the ammonia preliminary treatment was 800 to 950° C., the surface roughness was sufficiently small, and, where it was 850° C. or more, the surface roughness was further improved.

<Third Embodiment>

Figure 10:
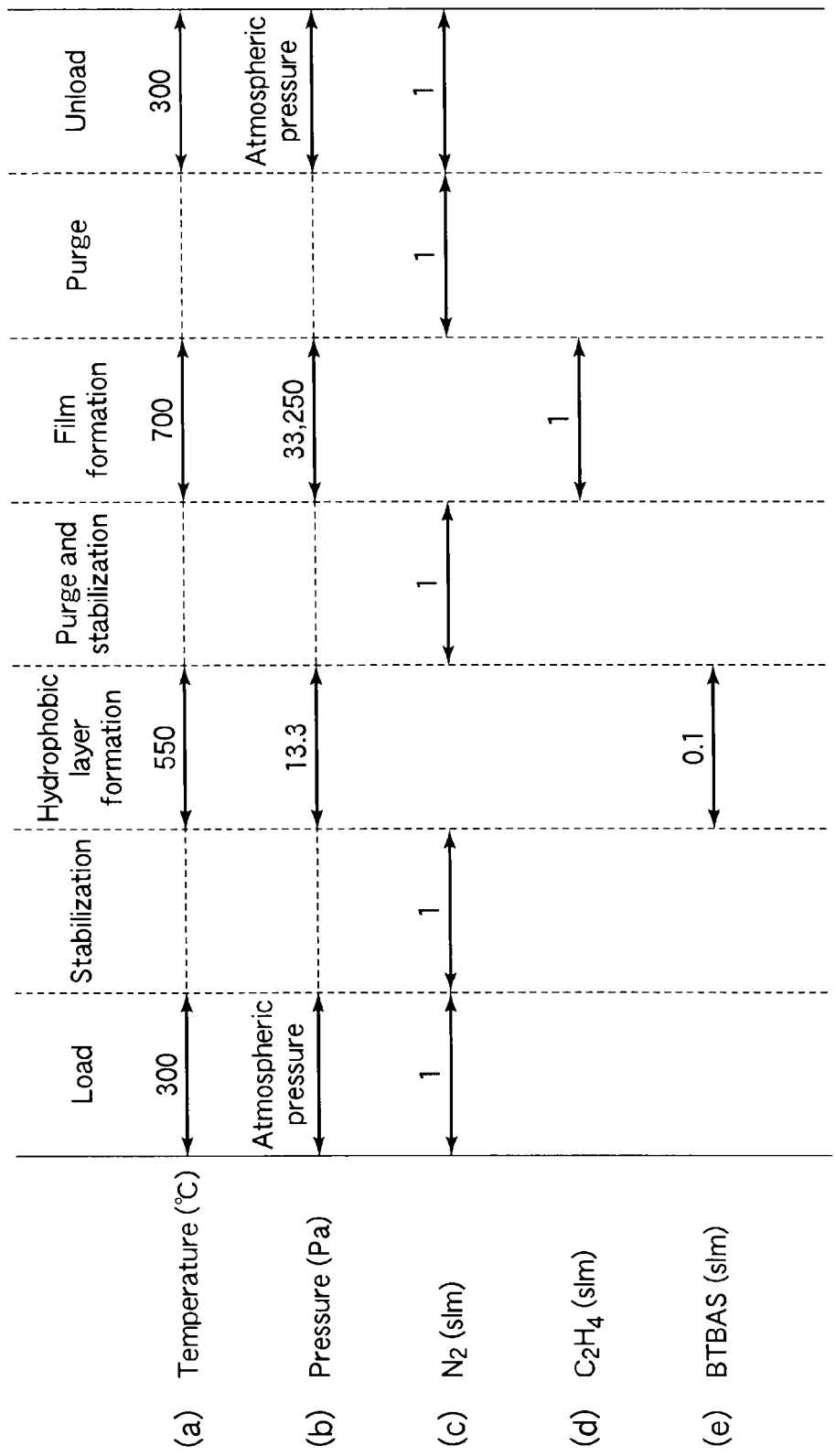
FIG. 10 is a view showing the recipe of a batch processing method for forming a structure including an amorphous carbon film according to a third embodiment of the present invention.

FIG. 10 is a view showing the recipe of a batch processing method for forming a structure including an amorphous carbon film according to a third embodiment of the present invention. In this method, a preliminary treatment is performed to form a hydrophobic layer consisting of silicon by CVD, while supplying BTBAS (bistertialbutylaminosilane) gas, to cover the underlying layer on each of the semiconductor wafers W with the hydrophobic layer. Then, an amorphous carbon film is formed on the hydrophobic layer.

Specifically, at first, the inside of the reaction tube 2 is heated by the heater 16 at a predetermined load temperature, such as 300° C., as shown in FIG. 10, (a). Further, nitrogen ($N_2$) gas is supplied through the purge gas feed line 18 into the reaction tube 2 at a predetermined flow rate, such as 1 slm, as shown in FIG. 10, (c). Then, a wafer boat 11 that holds semiconductor wafers W is placed on the lid 6, and the lid 6 is moved up by the boat elevator 128. Consequently, the wafer boat 11 with the semiconductor wafers W supported thereon is loaded into the reaction tube 2 and the reaction tube 2 is airtightly closed (load step).

Then, nitrogen gas is supplied through the purge gas feed line 18 into the reaction tube 2 at a predetermined flow rate, such as 1 slm, as shown in FIG. 10, (c). Further, the inside of the reaction tube 2 is heated by the heater 16 to a predetermined temperature, such as 550° C., as shown in FIG. 10, (a). Furthermore, gas is exhausted from inside the reaction tube 2 to set the inside of the reaction tube 2 at a predetermined pressure, such as 13.3 Pa (0.1 Torr), as shown in FIG. 10, (b). By doing so, the inside of the reaction tube 2 is stabilized at the temperature and pressure described above (stabilization step).

At this time, the temperature inside the reaction tube 2 is preferably set to be 950° C. or lower. If this temperature is higher than 950° C., the semiconductor wafers W may cause roughening of the surface and thereby increase the surface roughness of the amorphous carbon film. Further, this temperature is preferably set to be not higher than the temperature inside the reaction tube 2 used in the amorphous carbon film formation described later. Since the silicon film (hydrophobic layer) can be formed at a relatively low temperature, the temperature inside the reaction tube 2 should be decreased. For example, where the temperature inside the reaction tube 2 during the amorphous carbon film formation is set at 700° C., the temperature inside the reaction tube 2 during the hydrophobic layer formation is preferably set to be from room temperature to 700° C., and more preferably to be 400 to 700° C. The silicon film can be reliably formed by supplying BTBAS gas under a temperature of 400° C. or more. Further, the pressure inside the reaction tube 2 is preferably set to be 1.33 Pa (0.01 Torr) to 1,330 Pa (10 Torr), and more preferably to be 13.3 Pa (0.1 Torr) to 133 Pa (1 Torr).

When the inside of the reaction tube 2 is stabilized at the predetermined pressure and temperature, the supply of nitrogen gas through the purge gas feed line 18 is stopped. Then, BTBAS gas is supplied through a process gas feed line 17 into the reaction tube 2 at a predetermined flow rate, such as 0.1 slm, as shown in FIG. 10, (e). Consequently, a silicon film (hydrophobic layer) having a predetermined thickness is formed to cover the underlying layer (the substrate of the wafers W or a layer of, e.g., metal, semiconductor, or insulator formed on the wafers W) on the surface of the semiconductor wafers W (hydrophobic layer formation step). This silicon film is a hydrophobic layer, which prevents water from being adsorbed on the area where the amorphous carbon film is to be formed. Accordingly, when the amorphous carbon film is formed, an abnormal reaction accompanied by etching at the interface between the underlying layer and amorphous carbon film can be hardly caused, and so the surface roughness is suppressed.

When the silicon film formed on the surface of the semiconductor wafers W reaches a predetermined thickness, the supply of BTBAS gas through the process gas feed line 17 is stopped. Then, while gas is exhausted from inside the reaction tube 2, nitrogen gas is supplied through the purge gas feed line 18 into the reaction tube 2 at a predetermined flow rate, such as 1 slm, as shown in FIG. 10, (c). Then, gas is exhausted from inside the reaction tube 2 to set the inside of the reaction tube 2 at a predetermined pressure, such as 33,250 Pa (250 Torr), as shown in FIG. 10, (b). Further, the inside of the reaction tube 2 is heated by the heater 16 to a predetermined temperature, such as 700° C., as shown in FIG. 10, (a). By doing so, the inside of the reaction tube 2 is stabilized at the temperature and pressure described above (purge and stabilization step).

At this time, the temperature inside the reaction tube 2 is preferably set to be 600 to 900° C., and more preferably to be 700 to 850° C. If this temperature is higher than 900° C., the surface roughness of the amorphous carbon film may become larger. If this temperature is lower than 600° C., it may become difficult to lower the pressure inside the reaction tube 2, thereby deteriorate the surface flatness of the amorphous carbon film. The pressure inside the reaction tube 2 is preferably set to be 13.3 Pa (0.1 Torr) to 66,500 Pa (500 Torr), and more preferably to be 66.5 Pa (0.5 Torr) to 53,200 Pa (400 Torr).

When the inside of the reaction tube 2 is stabilized at the predetermined pressure and temperature, the supply of nitrogen gas through the purge gas feed line 18 is stopped. Then, a film formation gas (hydrocarbon gas) is supplied through a process gas feed line 17 into the reaction tube 2 at a predetermined flow rate. In this embodiment, for example, ethylene ($C_2H_4$) gas is supplied at 1 slm, as shown in FIG. 10, (d). The film formation gas supplied into the reaction tube 2 causes a thermal decomposition reaction, using heat inside the reaction tube 2. Consequently, an amorphous carbon film is formed on the silicon film (hydrophobic layer) (film formation step).

As described above, since the silicon film serving as a hydrophobic layer is formed to cover the underlying layer on the semiconductor wafers W before the amorphous carbon film is formed, an abnormal reaction accompanied by etching at the interface between the underlying layer and amorphous carbon film can be hardly caused during the film formation, and so the surface roughness becomes smaller. Further, since the amorphous carbon film is formed by a vertical CVD apparatus of the batch type, the amorphous carbon film is formed with better coverage performance. Accordingly, this method makes it possible to form an amorphous carbon film with better coverage performance and smaller surface roughness. Further, in this embodiment, the temperature inside the reaction tube 2 during the hydrophobic layer formation is set to be not higher than 700° C., which is the temperature inside the reaction tube 2 during the amorphous carbon film formation. Accordingly, the temperature inside the reaction tube 2 is lowered in the process sequence.

When the amorphous carbon film formed on the surface of the semiconductor wafers W reaches a predetermined thickness, the supply of film formation gas through the process gas feed line 17 is stopped. Then, while gas is exhausted from inside reaction tube 2, nitrogen gas is supplied through the purge gas feed line 18 into reaction tube 2 at a predetermined flow rate, such as 1 slm, as shown in FIG. 10, (c). By doing so, the gas is exhausted from inside the reaction tube 2 to the exhaust line 5 (purge step). It is preferable to perform cyclic purge of repeating the gas exhaust and nitrogen gas supply for the inside of the reaction tube 2 a plurality of times, in order to reliably exhaust gas from inside the reaction tube 2.

Then, nitrogen gas is supplied through the purge gas feed line 18 into the reaction tube 2 at a predetermined flow rate, such as 1 slm, as shown in FIG. 10, (c), so that the pressure inside the reaction tube 2 is returned to atmospheric pressure, as shown in FIG. 10, (b). Further, the inside of the reaction tube 2 is set by the heater 16 at a predetermined temperature, such as 300° C., as shown in FIG. 10, (a). Then, the lid 6 is moved down by the boat elevator 128, and the semiconductor wafers W are thereby unloaded along with wafer boat 11 from the reaction tube 2 (unload step). The formation of the amorphous carbon film is thus completed.

<Experiment 4>

In order to confirm some effects of the hydrophobic layer according to the third embodiment, an experiment was performed, as follows. In this experiment, an Si wafer, an $SiO_2$ wafer, and an SiN wafer were used as target objects. As a present example PE12, the hydrophobic layer formation using BTBAS gas and the amorphous carbon film formation were performed under the conditions described in the third embodiment. As a present example PE13 for comparison, the ammonia preliminary treatment according to the second embodiment was performed at 950° C. and 16,000 Pa (120 Torr), in place of the hydrophobic layer formation, and then the amorphous carbon film formation was performed under the same conditions as those of the present example PE12.

Then, the surface roughness of the amorphous carbon films formed in these present examples was examined while an atomic force microscope compliant with JIS B0601 was used to measure the surface roughness (Ra).

Figure 11:
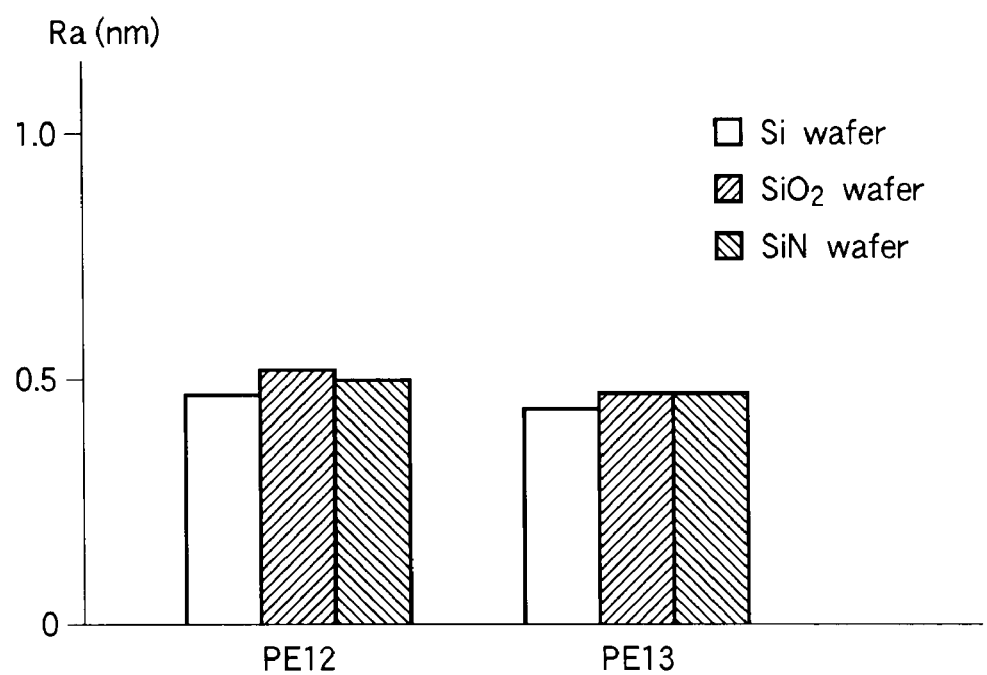
FIG. 11 is a view showing the surface roughness (Ra) of amorphous carbon films obtained by an experiment 4.

FIG. 11 is a view showing the surface roughness (Ra) of the amorphous carbon films obtained by the experiment 4. As shown in FIG. 11, the surface roughness became smaller by forming the hydrophobic layer as in the case using the ammonia preliminary treatment. Further, the coverage performance of the present examples PE12 and PE13 was examined and found that it was as good as 90% or more for all the types of target object. As described above, it has been confirmed that the batch processing method including the hydrophobic layer formation thus performed makes it possible to form an amorphous carbon film with better coverage performance and smaller surface roughness. Further, the batch processing method including the hydrophobic layer formation allows the temperature inside the reaction tube 2 to be lowered in the process sequence.

<Fourth Embodiment>

Figure 12:
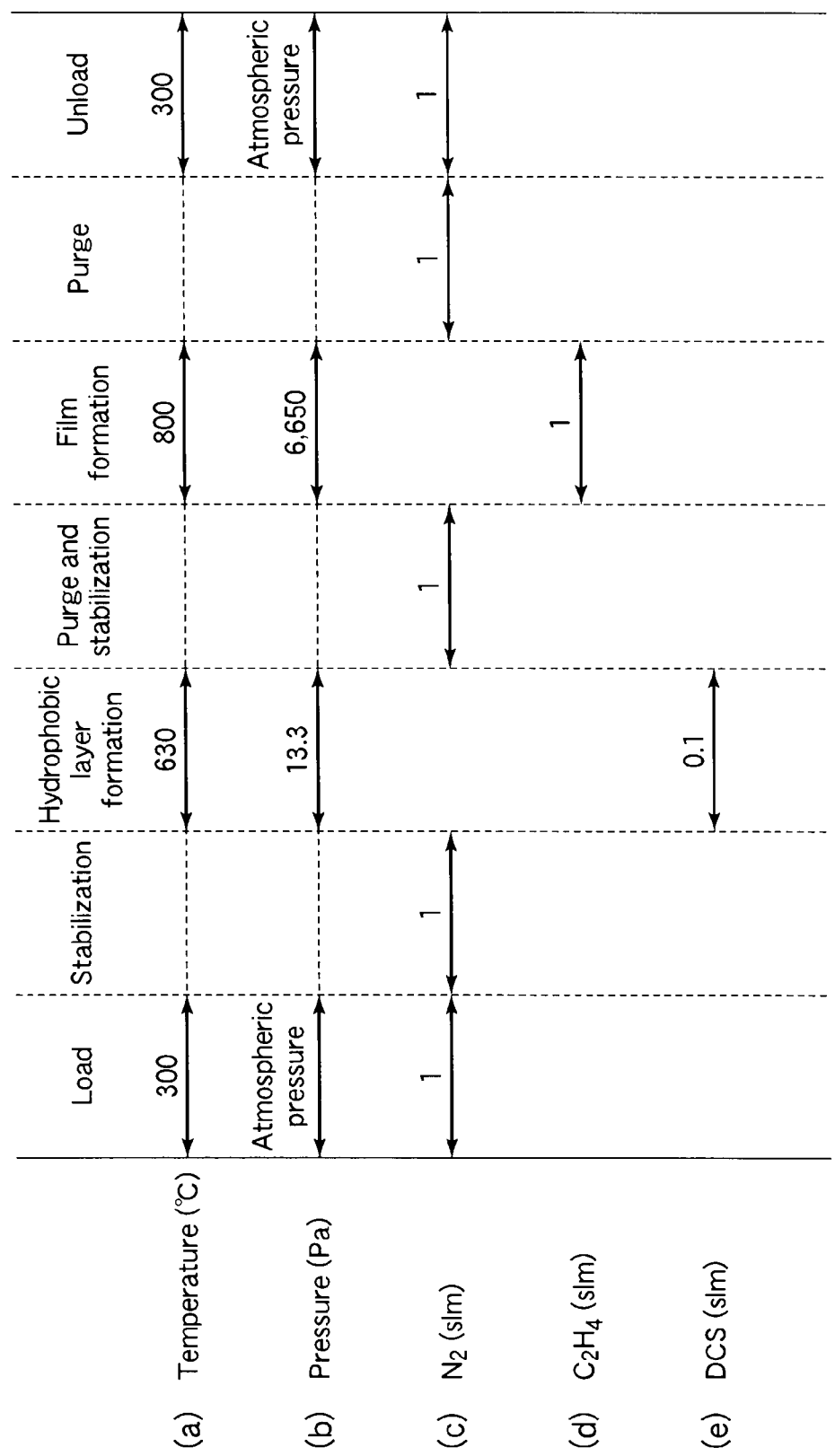
FIG. 12 is a view showing the recipe of a batch processing method for forming a structure including an amorphous carbon film according to a fourth embodiment of the present invention.

FIG. 12 is a view showing the recipe of a batch processing method for forming a structure including an amorphous carbon film according to a fourth embodiment of the present invention. In this method, a preliminary treatment is performed to form a hydrophobic layer consisting of silicon by CVD, while supplying DCS (dichlorosilane) gas, to cover the underlying layer on each of the semiconductor wafers W with the hydrophobic layer. Then, an amorphous carbon film is formed on the hydrophobic layer.

Specifically, at first, the inside of the reaction tube 2 is heated by the heater 16 at a predetermined load temperature, such as 300° C., as shown in FIG. 12, (a). Further, nitrogen ($N_2$) gas is supplied through the purge gas feed line 18 into the reaction tube 2 at a predetermined flow rate, such as 1 slm, as shown in FIG. 12, (c). Then, a wafer boat 11 that holds semiconductor wafers W is placed on the lid 6, and the lid 6 is moved up by the boat elevator 128. Consequently, the wafer boat 11 with the semiconductor wafers W supported thereon is loaded into the reaction tube 2 and the reaction tube 2 is airtightly closed (load step).

Then, nitrogen gas is supplied through the purge gas feed line 18 into the reaction tube 2 at a predetermined flow rate, such as 1 slm, as shown in FIG. 12, (c). Further, the inside of the reaction tube 2 is heated by the heater 16 to a predetermined temperature, such as 630° C., as shown in FIG. 12, (a). Furthermore, gas is exhausted from inside the reaction tube 2 to set the inside of the reaction tube 2 at a predetermined pressure, such as 13.3 Pa (0.1 Torr), as shown in FIG. 12, (b). By doing so, the inside of the reaction tube 2 is stabilized at the temperature and pressure described above (stabilization step).

At this time, the temperature inside the reaction tube 2 is preferably set to be 950° C. or lower. If this temperature is higher than 950° C., the semiconductor wafers W may cause roughening of the surface and thereby increase the surface roughness of the amorphous carbon film. Further, this temperature is preferably set to be not higher than the temperature inside the reaction tube 2 used in the amorphous carbon film formation described later. For example, where the temperature inside the reaction tube 2 during the amorphous carbon film formation is set at 800° C., the temperature inside the reaction tube 2 during the hydrophobic layer formation is preferably set to be from room temperature to 800° C., and more preferably to be 400 to 800° C. Further, the pressure inside the reaction tube 2 is preferably set to be 1.33 Pa (0.01 Torr) to 1,330 Pa (10 Torr), and more preferably to be 13.3 Pa (0.1 Torr) to 133 Pa (1 Torr).

When the inside of the reaction tube 2 is stabilized at the predetermined pressure and temperature, the supply of nitrogen gas through the purge gas feed line 18 is stopped. Then, DCS gas is supplied through a process gas feed line 17 into the reaction tube 2 at a predetermined flow rate, such as 0.1 slm, as shown in FIG. 12, (e). Consequently, a silicon film (hydrophobic layer) having a predetermined thickness is formed to cover the underlying layer (the substrate of the wafers W or a layer of, e.g., metal, semiconductor, or insulator formed on the wafers W) on the surface of the semiconductor wafers W (hydrophobic layer formation step).

When the silicon film formed on the surface of the semiconductor wafers W reaches a predetermined thickness, the supply of DCS gas through the process gas feed line 17 is stopped. Then, while gas is exhausted from inside the reaction tube 2, nitrogen gas is supplied through the purge gas feed line 18 into the reaction tube 2 at a predetermined flow rate, such as 1 slm, as shown in FIG. 12, (c). Then, gas is exhausted from inside the reaction tube 2 to set the inside of the reaction tube 2 at a predetermined pressure, such as 6,650 Pa (50 Torr), as shown in FIG. 12, (b). Further, the inside of the reaction tube 2 is heated by the heater 16 to a predetermined temperature, such as 800° C., as shown in FIG. 12, (a). By doing so, the inside of the reaction tube 2 is stabilized at the temperature and pressure described above (purge and stabilization step). At this time, the preferable ranges of the temperature and pressure inside the reaction tube 2 are the same as those of the third embodiment.

When the inside of the reaction tube 2 is stabilized at the predetermined pressure and temperature, the supply of nitrogen gas through the purge gas feed line 18 is stopped. Then, a film formation gas (hydrocarbon gas) is supplied through a process gas feed line 17 into the reaction tube 2 at a predetermined flow rate. In this embodiment, for example, ethylene ($C_2H_4$) gas is supplied at 1 slm, as shown in FIG. 12, (d). The film formation gas supplied into the reaction tube 2 causes a thermal decomposition reaction, using heat inside the reaction tube 2. Consequently, an amorphous carbon film is formed on the silicon film (hydrophobic layer) (film formation step).

When the amorphous carbon film formed on the surface of the semiconductor wafers W reaches a predetermined thickness, the supply of film formation gas through the process gas feed line 17 is stopped. Then, while gas is exhausted from inside reaction tube 2, nitrogen gas is supplied through the purge gas feed line 18 into reaction tube 2 at a predetermined flow rate, such as 1 slm, as shown in FIG. 12, (c). By doing so, the gas is exhausted from inside the reaction tube 2 to the exhaust line 5 (purge step). It is preferable to perform cyclic purge of repeating the gas exhaust and nitrogen gas supply for the inside of the reaction tube 2 a plurality of times, in order to reliably exhaust gas from inside the reaction tube 2.

Then, nitrogen gas is supplied through the purge gas feed line 18 into the reaction tube 2 at a predetermined flow rate, such as 1 slm, as shown in FIG. 12, (c), so that the pressure inside the reaction tube 2 is returned to atmospheric pressure, as shown in FIG. 12, (b). Further, the inside of the reaction tube 2 is set by the heater 16 at a predetermined temperature, such as 300° C., as shown in FIG. 12, (a). Then, the lid 6 is moved down by the boat elevator 128, and the semiconductor wafers W are thereby unloaded along with wafer boat 11 from the reaction tube 2 (unload step). The formation of the amorphous carbon film is thus completed.

<Experiment 5>

In order to confirm some effects of the hydrophobic layer according to the fourth embodiment, an experiment was performed, as follows. In this experiment, an $SiO_2$ wafer was used as a target object. As a present example PE14, the hydrophobic layer formation using DCS gas (for ten minutes) and the amorphous carbon film formation were performed under the conditions described in the fourth embodiment. As a present example PE15 for comparison, the hydrophobic layer formation using BTBAS gas in place of the DCS gas (for ten minutes) was performed under the conditions described in the third embodiment, and then the amorphous carbon film formation was performed under the same conditions as those of the present example PE14.

Then, the surface roughness of the amorphous carbon films formed in these present examples was examined while an atomic force microscope compliant with JIS B0601 was used to measure the surface roughness (Ra). In the experiment 5, wafers placed at the top (TOP), center (CENTER), and bottom (BOTTOM) of the wafer boat 11 were used as samples to examine the surface roughness of the amorphous carbon films.

Figure 13:
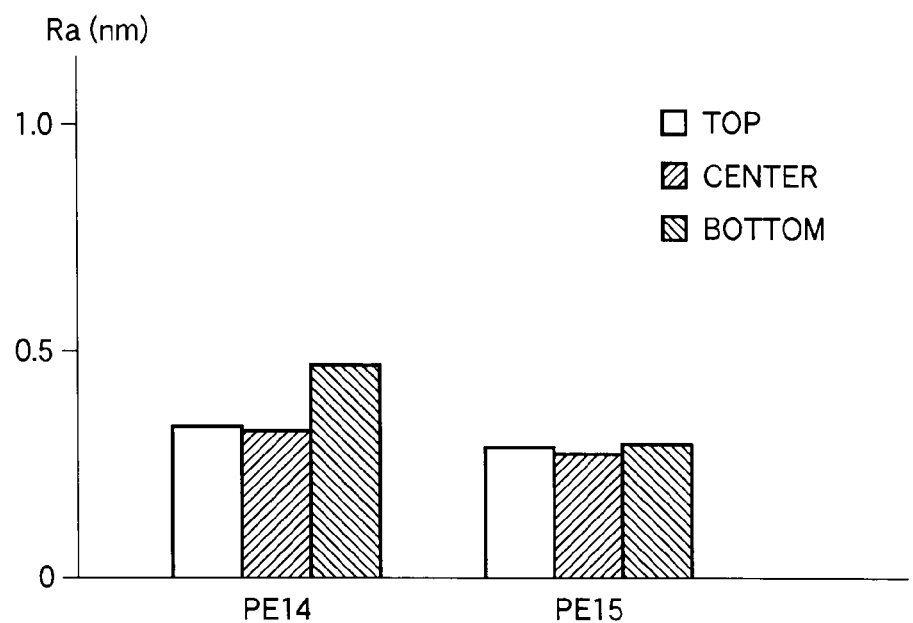
FIG. 13 is a view showing the surface roughness (Ra) of amorphous carbon films obtained by an experiment 5.

FIG. 13 is a view showing the surface roughness (Ra) of the amorphous carbon films obtained by the experiment 5. As shown in FIG. 13, both of the present examples PE14 and PE15 rendered a decrease in the surface roughness by forming the hydrophobic layer, though the surface roughness of the present example PE15 using BTBAS gas containing no chlorine was smaller than that of the PE14 using DCS gas. Further, the coverage performance of the present examples PE14 and PE15 was examined and found that it was as good as 90% or more for all the sampled target objects. As described above, it has been confirmed that the batch processing method including the hydrophobic layer formation thus performed by use of either of BTBAS gas or DCS gas makes it possible to form an amorphous carbon film with better coverage performance and smaller surface roughness. Further, the batch processing method including the hydrophobic layer formation allows the temperature inside the reaction tube 2 to be lowered in the process sequence.

<Application to Multi-Layered Resist Structure>

Figure 14:
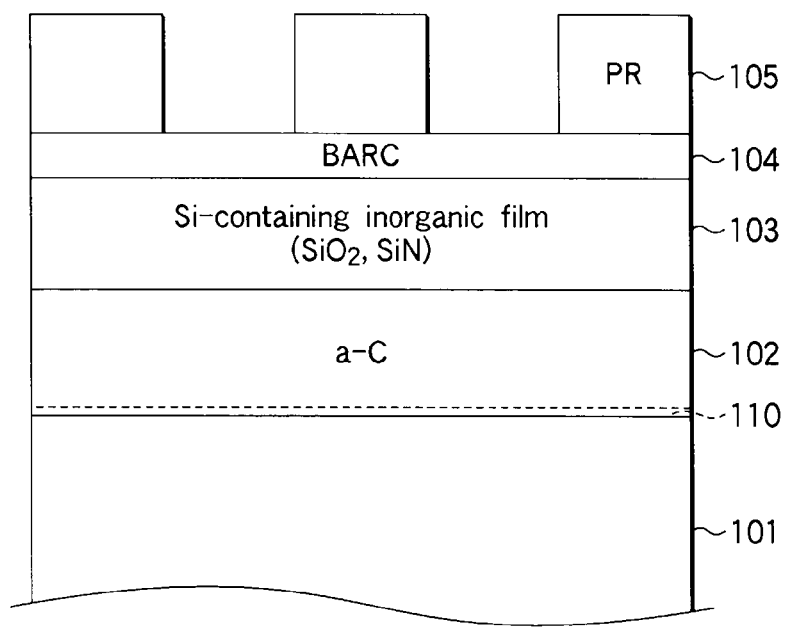
FIG. 14 is a sectional view showing a multi-layered resist structure, to which the method according to each of the embodiments is applied.

The batch processing method for forming a structure including an amorphous carbon film according to each of the first to fourth embodiments is effectively applicable to a method for forming a multi-layered resist structure that is used for etching an underlying layer, particularly a hydrophilic underlying layer, such as a silicon oxide film or silicon nitride film, on the surface of a target object. FIG. 14 is a sectional view showing a multi-layered resist structure, to which the method according to each of the embodiments is applied. As shown in FIG. 14, the multi-layered resist structure is disposed on an etching target film (underlying layer) 101 and includes an amorphous carbon film (a-C) 102, an Si-containing inorganic film 103 used as a hard mask layer, an anti-reflection coating film (BARC) 104, and a resist film (PR) 105 formed in this order from below. When this structure is used for etching, the resist film 105 is patterned by photolithography and then this pattern is copied on the Si-containing inorganic film 103 and amorphous carbon film 102. Then, these layers are used as a mask to etch the etching target film 101.

Where the method according to either of the first and second embodiments is used, the preliminary treatment is first performed to remove water (moisture) from the surface of the etching target film 101, and then the amorphous carbon film 102 is formed directly on the etching target film 101. In this case, the amorphous carbon film 102 preferably has a thickness of 5 to 300 nm. On the other hand, where the method according to either of the third and fourth embodiments is used, the preliminary treatment is first performed to form a hydrophobic layer 110 of silicon for covering the etching target film 101, and then the amorphous carbon film 102 is formed on the hydrophobic layer 110. In this case, the hydrophobic layer 110 preferably has a thickness of 0.1 to 3 nm, and the amorphous carbon film 102 preferably has a thickness of 5 to 300 nm.

The Si-containing inorganic film 103 is formed of an $SiO_2$ film, SiN film, or a multi-layered film of them. The Si-containing inorganic film 103 may be formed by CVD in the same reaction tube 2 subsequently to formation of the amorphous carbon film 102. For example, where the Si-containing inorganic film 103 is an SiN film, this film may be formed while supplying BTBAS gas, which is aminosilane containing no chlorine (Cl), as a silicon source gas, and supplying ammonia gas as a reactive gas or nitriding gas. Since these gases are used as gases for the preliminary treatment in the third embodiment and second embodiment, respectively, this film formation can share some gas supply circuits with the preliminary treatment. On the other hand, in general, the resist film (PR) 105 is formed on the Si-containing inorganic film 103 by coating, and so it should be formed outside the reaction tube 2.

Where each of the embodiments is combined with formation of the Si-containing inorganic film 103, the amorphous carbon film formation is followed by a process, as follows. Specifically, nitrogen gas is supplied through the purge gas feed line 18 into the reaction tube 2 at a predetermined flow rate. Further, the inside of the reaction tube 2 is heated by the heater 16 to a predetermined film formation temperature (process temperature), such as 500 to 650° C. Furthermore, gas is exhausted from inside the reaction tube 2 to set the inside of the reaction tube 2 at a predetermined pressure, such as 13.3 Pa (0.1 Torr) to 133 Pa (1 Torr). By doing so, the inside of the reaction tube 2 is stabilized at the temperature and pressure described above (stabilization step).

When the inside of the reaction tube 2 is stabilized at the predetermined pressure and temperature, the supply of nitrogen gas through the purge gas feed line 18 is stopped. Then, BTBAS gas and ammonia gas are respectively supplied through two process gas feed lines 17 into the reaction tube 2 at predetermined flow rates. The BTBAS gas and ammonia gas supplied into the reaction tube 2 cause a thermal decomposition reaction, using heat inside the reaction tube 2. The decomposition components produce silicon nitride ($Si_3N_4$), from which the Si-containing inorganic film 103 is formed on the amorphous carbon film 102 (film formation step).

<Consequences and Modifications>

As described above, according to the first to fourth embodiments, before an amorphous carbon film is formed on an underlying layer on the surface of semiconductor wafers W, a preliminary treatment is performed to remove water (moisture) from the surface of the underlying layer or to cover the underlying layer with a hydrophobic layer. Consequently, the amorphous carbon film is formed with better coverage performance and smaller surface roughness. In addition, where the preliminary treatment to remove water (moisture) from the surface of the underlying layer is performed, the deposition rate is improved. Where the preliminary treatment to form the hydrophobic layer is performed, the temperature inside the reaction tube 2 can be lowered in the process sequence.

In the explanation described above, the $N_2$ preliminary treatment, ammonia preliminary treatment, and hydrophobic layer formation are performed independently of each other. However, these processes may be combined with each other in light of the type of the underlying layer for the amorphous carbon film, effects on semiconductor devices, and so forth. In the third and fourth embodiments, the hydrophobic layer is formed of a silicon film, but the hydrophobic layer may be made of another hydrophobic material, as far as it does not adversely affect semiconductor devices.

In the explanation described above, the moisture removing gas for performing the preliminary treatment and the reactive gas for forming the Si-containing inorganic film are activated when they are supplied into the reaction tube 2 heated to a predetermined temperature. Alternatively, the moisture removing gas and/or the reactive gas may be supplied into the reaction tube 2, while being activated outside the reaction tube 2 by an activation mechanism GAM (see FIG. 1), which is disposed on the corresponding process gas feed line 17. In this case, the temperature inside the reaction tube 2 can be lowered during the preliminary treatment and/or the Si-containing inorganic film formation. The activation mechanism GAM may be arranged to utilize one or more media selected from the group consisting of heat, plasma, light, and catalyst.

In the third and fourth embodiments, the silicon source gas is BTBAS gas or DCS gas, but the silicon source gas may be another gas, such as, HCD or aminosilane, e.g., TDMAS. The temperature inside the reaction tube 2 is preferably set to be from room temperature to 600° C. for using BTBAS gas, to be 400 to 630° C. for using DCS gas, to be 300 to 550° C. for using HCD gas, or to be from room temperature to 550° C. for using TDMAS gas.

In the explanation described above, the heat-processing apparatus employed is a heat-processing apparatus of the batch type having a single-tube structure. However, for example, the present invention may be applied to a vertical heat-processing apparatus of the batch type having a reaction tube of the double-tube type, which is formed of inner and outer tubes. The target object is not limited to a semiconductor wafer W, and it may be a glass substrate for, e.g., an LCD.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A batch processing method for forming a structure including an amorphous carbon film by use of a hydrocarbon gas, the method comprising:

placing a plurality of target objects at intervals in a vertical direction on an inside of a reaction chamber, each of the target objects including an underlying layer on which the structure is to be formed;

then performing a preliminary treatment on a surface of the underlying layer by ammonia gas serving as a preliminary treatment gas, the preliminary treatment supplying the preliminary treatment gas into the reaction chamber without supplying the hydrocarbon gas into the reaction chamber while exhausting gas from inside the reaction chamber and setting the inside of the reaction chamber at a preliminary treatment temperature of 800 to 950° C. and a pressure of 133 to 53,200 Pa to activate the preliminary treatment gas only by heating at the preliminary treatment temperature; and then performing main CVD (chemical vapor deposition) of forming an amorphous carbon film on the underlying layer, the main CVD supplying the hydrocarbon gas into the reaction chamber without supplying the preliminary treatment gas into the reaction chamber while exhausting gas from inside the reaction chamber and setting the inside of the reaction chamber at a main process temperature to activate the hydrocarbon gas only by heating at the main process temperature.

2. The method according to claim 1, wherein the preliminary treatment sets the inside of the reaction chamber at a pressure of 133 to 26,600 Pa.

3. The method according to claim 1, wherein, between the preliminary treatment and the main CVD, the method further comprises purging the inside of the reaction chamber by supplying nitrogen gas into the reaction chamber while exhausting gas from inside the reaction chamber.

4. The method according to claim 1, wherein the main process temperature is not higher than the preliminary treatment temperature.

5. The method according to claim 1, wherein the hydrocarbon gas is ethylene, which is supplied without being preexcited into the reaction chamber, and the main CVD sets the inside of the reaction chamber at the main process temperature of 800 to 900° C. and a pressure of 13.3 to 6,650 Pa.

6. The method according to claim 1, wherein, after the main CVD, the method further comprises performing second CVD of forming an Si-containing inorganic film on the amorphous carbon film by heating the inside of the reaction chamber and supplying a silicon source gas and a reactive gas selected from the group consisting of an oxidizing gas and a nitriding gas into the reaction chamber while exhausting gas from inside the reaction chamber.

7. The method according to claim 6, wherein the amorphous carbon film and the Si-containing inorganic film form a multi-layered resist structure in cooperation with a photo-resist film to be formed on the Si-containing inorganic film outside the reaction chamber, and the multi-layered resist structure, which includes the amorphous carbon film, the Si-containing inorganic film, and the photo-resist film, serves as an etching mask for etching the underlying layer.

8. The method according to claim 6, wherein the reactive gas is ammonia gas.

9. A non-transitory computer readable storage medium containing program instructions for execution on a processor, which, when executed by the processor, control a film formation apparatus to perform a method according to claim 1.

10. A batch processing method for forming a structure including an amorphous carbon film by use of a hydrocarbon gas, the method comprising:
    placing a plurality of target objects at intervals in a vertical direction on an inside of a reaction chamber, each of the target objects including an underlying layer on which the structure is to be formed;
    then performing a preliminary treatment of forming a hydrophobic layer consisting essentially of silicon to cover the underlying layer with the hydrophobic layer, the preliminary treatment supplying a silicon source gas serving as a preliminary treatment gas into the reaction chamber without supplying the hydrocarbon gas into the reaction chamber while exhausting gas from inside the reaction chamber and setting the inside of the reaction chamber at a preliminary treatment temperature to activate the preliminary treatment gas only by heating at the preliminary treatment temperature; and
    then performing main CVD (chemical vapor deposition) of forming an amorphous carbon film on the hydrophobic layer, the main CVD supplying the hydrocarbon gas into the reaction chamber without supplying the preliminary treatment gas into the reaction chamber while exhausting gas from inside the reaction chamber and setting the inside of the reaction chamber at a main process temperature to activate the hydrocarbon gas only by heating at the main process temperature.

11. The method according to claim 10, wherein the silicon source gas is an aminosilane gas containing no chlorine.

12. The method according to claim 11, wherein the preliminary treatment sets the inside of the reaction chamber at the preliminary treatment temperature of from room temperature to 700° C. and a pressure of 1.33 to 1,330 Pa.

13. The method according to claim 10, wherein, between the preliminary treatment and the main CVD, the method further comprises purging the inside of the reaction chamber by supplying nitrogen gas into the reaction chamber while exhausting gas from inside the reaction chamber.

14. The method according to claim 10, wherein the preliminary treatment temperature is not higher than the main process temperature.

15. The method according to claim 10, wherein the hydrocarbon gas is ethylene, which is supplied without being pre-excited into the reaction chamber, and the main CVD sets the inside of the reaction chamber at the main process temperature of 600 to 900° C. and a pressure of 13.3 to 66,500 Pa.

16. The method according to claim 10, wherein, after the main CVD, the method further comprises performing second CVD of forming an Si-containing inorganic film on the amorphous carbon film by heating the inside of the reaction chamber and supplying a silicon source gas and a reactive gas selected from the group consisting of an oxidizing gas and a nitriding gas into the reaction chamber while exhausting gas from inside the reaction chamber.

17. The method according to claim 16, wherein the amorphous carbon film and the Si-containing inorganic film form a multi-layered resist structure in cooperation with a photo-resist film to be formed on the Si-containing inorganic film outside the reaction chamber, and the multi-layered resist structure, which includes the amorphous carbon film, the Si-containing inorganic film, and the photo-resist film, serves as an etching mask for etching the underlying layer.

18. The method according to claim 16, wherein the preliminary treatment gas is the same gas as the silicon source gas supplied in the second CVD.

19. A non-transitory computer readable storage medium containing program instructions for execution on a processor, which, when executed by the processor, control a film formation apparatus to perform a method according to claim 10.

20. The method according to claim 10, wherein the hydrophobic layer has a thickness of 0.1 to 3 nm.

* * * * *